(12) United States Patent
Kuo et al.

(10) Patent No.: US 9,425,126 B2
(45) Date of Patent: Aug. 23, 2016

(54) DUMMY STRUCTURE FOR CHIP-ON-WAFER-ON-SUBSTRATE

(71) Applicant: Taiwan Semiconductor Manufacturing Company, Ltd., Hsin-Chu (TW)

(72) Inventors: Pei-Ching Kuo, Hsin-Chu (TW); Yi-Hsiu Chen, Hsinchu (TW); Jun-Lin Yeh, Taipei (TW); Yung-Chi Lin, Su-Lin (TW); Li-Han Hsu, Hsin-Chu (TW); Wei-Cheng Wu, Hsin-Chu (TW); Ku-Feng Yang, Baoshan Township (TW); Wen-Chih Chiou, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 6 days.

(21) Appl. No.: 14/289,819

(22) Filed: May 29, 2014

(65) Prior Publication Data

US 2015/0348872 A1 Dec. 3, 2015

(51) Int. Cl.
*H01L 23/00* (2006.01)
*H01L 23/48* (2006.01)
*H01L 21/768* (2006.01)
*H01L 23/528* (2006.01)
*H01L 23/522* (2006.01)

(52) U.S. Cl.
CPC .......... *H01L 23/481* (2013.01); *H01L 21/7684* (2013.01); *H01L 21/76802* (2013.01); *H01L 21/76879* (2013.01); *H01L 21/76898* (2013.01); *H01L 23/522* (2013.01); *H01L 23/528* (2013.01); *H01L 24/06* (2013.01); *H01L 2224/05025* (2013.01); *H01L 2924/2075* (2013.01); *H01L 2924/20751* (2013.01)

(58) Field of Classification Search
CPC ...... H01L 23/481; H01L 23/06; H01L 23/528
See application file for complete search history.

(56) References Cited

U.S. PATENT DOCUMENTS

| 2011/0217841 A1* | 9/2011 | Chen | H01L 21/76898 438/667 |
| 2014/0264916 A1* | 9/2014 | Chao-Yuan | H01L 23/481 257/774 |

* cited by examiner

*Primary Examiner* — Matthew Reames
(74) *Attorney, Agent, or Firm* — Slater Matsil, LLP

(57) ABSTRACT

Apparatus, and methods of manufacture thereof, in which metal is deposited into openings, thus forming a plurality of metal pads, a plurality of through-silicon-vias (TSVs), a plurality of metal lines, a plurality of first dummy structures, and a plurality of second dummy structures. Ones of the plurality of first dummy structures each have a first width that is at least about three times greater than a second width of each of the plurality of metal lines, and ones of the plurality of second dummy structures each have a third width that is at least about five times greater than the second width of each of the plurality of metal lines.

20 Claims, 3 Drawing Sheets

DUMMY STRUCTURE FOR CHIP-ON-WAFER-ON-SUBSTRATE

BACKGROUND

In Chip-on-Wafer-on-Substrate (CoWoS) technology, through-silicon-vias and interconnects are utilized to integrate multiple chips into a single device. Other structures may also be included, such as dummy structures, and the formation of various features may be streamlined by being performed together. For example, multiple planarization steps may be combined into one. However, such combination may give rise to issues with metal bump height variation and overburden thickness, which may increase manufacturing costs and times.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
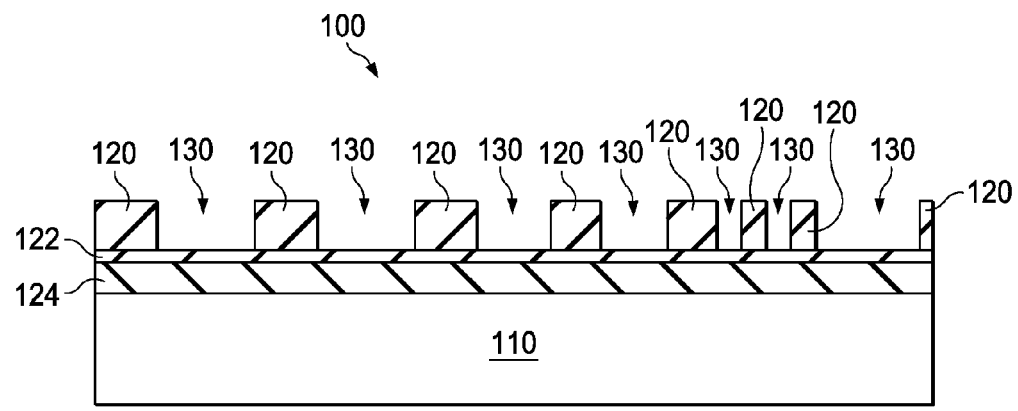
FIG. 1 is a sectional view of a portion of an apparatus in an intermediate stage of manufacture in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a sectional view of a portion of an apparatus 100 in an intermediate stage of manufacture according to one or more aspects of the present disclosure. The apparatus 100 may comprise a substrate 110 and a dielectric layer 120 on the substrate 110. A plurality of first openings 130 may be formed in the dielectric layer 120, as shown in FIG. 1. The substrate 110 may be or comprise a silicon on insulator (SOI) substrate, dielectric materials such as silicon oxide, or a bulk substrate formed of a semiconductor material, such as silicon, silicon germanium, silicon carbide, gallium arsenide, although other materials are also within the scope of the present disclosure.

The dielectric layer 120 may be formed over the substrate 110 via one or more processes, such as spin-on coating, chemical vapor deposition (CVD), physical vapor deposition (PVD), and/or others. The thickness of the dielectric layer 120 may range between about 1500 angstroms and about 4500 angstroms, such as about 3500 angstroms, although other thicknesses are also within the scope of the present disclosure. The dielectric layer 120 may comprise silicon oxide, a spin-on dielectric (SOD) material, polyimide, and/or other materials. Alternatively, the dielectric layer 120 may be formed of a low-k dielectric material having a k value lower than about 3.0, such as about 2.5, for example.

The dielectric layer 120 may comprise an anti-reflective-coating layer (not shown), such as a silicon oxynitride layer, and a dielectric portion of the dielectric layer 120 may interpose the anti-reflective-coating layer and the substrate. The apparatus 100 may further comprise another dielectric layer interposing the first dielectric layer and the substrate. For example, as depicted in FIG. 1, the second dielectric layer may comprise an etch-stop layer 122 and an isolation layer 124 interposing the etch-stop layer 122 and the substrate 110. The etch-stop layer may comprise one or more layers of silicon oxide, silicon nitride, silicon carbide, and/or other materials, and may have a thickness ranging between about 500 angstroms and about 1500 angstroms. Of course, other arrangements of the dielectric layers 120, 122, and 124 are also within the scope of the present disclosure.

The isolation layer 124 may comprise one or more layers of silicon oxide, silicon oxynitride, and/or another type of oxide, and may be formed through thermal oxidation of the substrate 110. Alternatively, the isolation layer 124 may comprise silicon oxide, silicon nitride, and/or other materials that may be formed utilizing one or more deposition and/or other material build-up processes. Of course, however, other materials and/or processes may also be utilized within the scope of the present disclosure.

Figure 2:
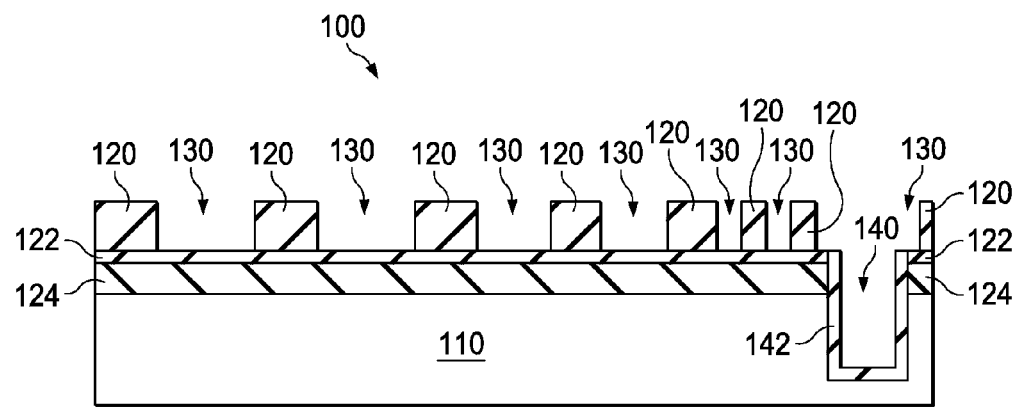
FIG. 2 is a sectional view of the apparatus shown in FIG. 1 in a subsequent stage of manufacture in accordance with some embodiments.

FIG. 2 is a sectional view of the apparatus shown in FIG. 1 in a subsequent stage of manufacture in accordance with some embodiments, wherein a through-silicon-via (TSV) opening 140 has been formed to extend through the dielectric layer 120 and into the substrate 110. A person having ordinary skill in the art will understand that, although only one TSV opening 140 is depicted in FIG. 2, multiple TSV openings 140 may be formed.

Forming the plurality of TSV opening 140 may comprise forming a photoresist layer (not shown) over the dielectric layer 120 and in the openings 130 that won't coincide with a TSV opening 140, and subsequently patterning the photoresist layer to form openings (not shown) where the TSV opening(s) 140 will be formed. Subsequent etching extends the photoresist layer openings to within the substrate 110, thus forming the TSV openings 140. Forming the openings 130 may occur prior to forming the TSV openings 140 so that the TSV openings 140 may be formed through corresponding ones of the openings 130.

An isolation layer 142 may line each of the TSV openings 140. The isolation layer 142 may be formed using thermal oxidation of the exposed surfaces of substrate 110. For example, thermal oxidation may selectively form the isolation layer 142 on only on surfaces of the TSV openings 140, without forming the isolation layer 142 on the dielectric layer 120.

Figure 3:
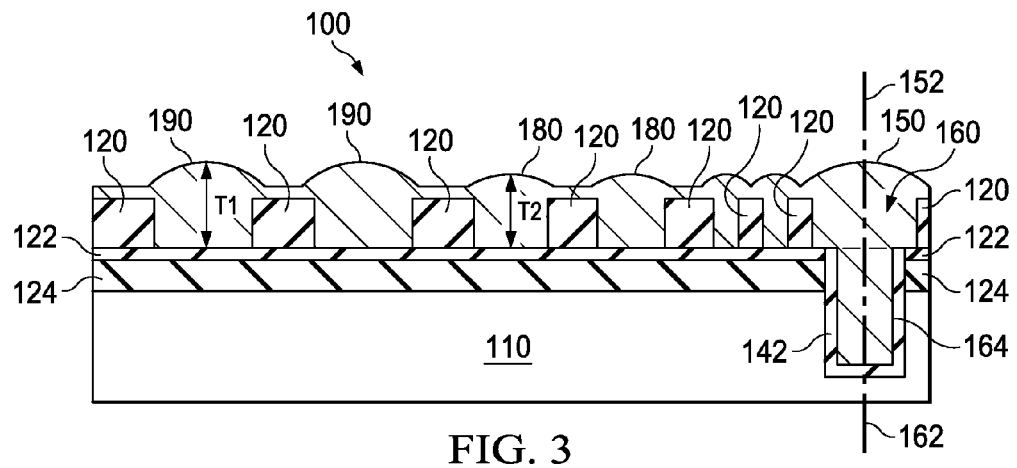
FIG. 3 is a sectional view of the apparatus shown in FIG. 2 in a subsequent stage of manufacture in accordance with some embodiments.

FIG. 3 is a sectional view of the apparatus shown in FIG. 2 in a subsequent stage of manufacture according to one or more aspects of the present disclosure. In FIG. 3, a metal has been deposited into, and thus fills, each of the openings 130 and each of the TSV openings 140. The metal has also been deposited on the dielectric layer 120. Accordingly, a plurality of metal features may be formed in the openings 130 and the TSV openings 140. Such formation may include forming the metal to a height that, at least before subsequent planarization, is greater than the upper (relative to the orientation on the page) surface 126 of the dielectric layer 120. The metal may comprise copper, gold, and/or other materials, and may be deposited using electrochemical plating (ECP) and/or other processes.

An example ECP process that may be utilized within the scope of the present disclosure may entail a bottom-up deposition process. For example, to accomplish a bottom-up deposition to achieve the configuration shown in FIG. 3, additive chemicals known as accelerators, suppressors, and levels may be added to the plating solution. The bottom-up filling may be seen as a consequence of competitive adsorption between inhibiting and accelerating species on the local surface.

That is, the accelerators are the stronger surfactant, and can be displaced and adsorbed at a faster rate than suppressors. At the same time, up-growth on non-planar geometries may lead to the enrichment of accelerators on advancing concave surfaces and dilution on convex areas. Because the metal deposition rate rises monotonically with the local accelerator surface coverage, it ensures that the deposition starts at the bottom of the trench or other opening and move upwards with no void formation. As the action of the accelerators can also be decreased by the addition of a cationic "leveling" surfactant (LEV), additive concentrations can be optimized to allow accelerator-derived, bottom-up filling, followed by LEV-induced accelerator deactivation.

In an example ECP process that may be utilized within the scope of the present disclosure, an acidic copper electroplating bath solution may include various suppressors, accelerators, and levelers. The additive concentrations may be selected to achieve rapid bottom-up fill optimization in the high aspect ratio openings 130 and 140, as well as microscopic and macroscopic uniformity. Consequently, post-ECP metal overburden may occur, particularly in the fabrication of dense circuit patterns. The overburden is that portion that extends above the upper surface 126 of the dielectric layer 120, necessitating subsequent removal by planarization and/or other material removal processes.

As described above, excessive overburden provides a significant source of metal particles generated during the planarization process, often inducing defects in device structures during the fabrication steps carried out after planarization. Accordingly, the ECP polymer additives for the ECP solution utilized within the scope of the present disclosure may be selected to reduce the overburden while optimizing the ECP gap-filling capability.

For example, the ECP polymer additives may comprise low cationic charge density copolymers having aromatic and amine functional group monomers. The low cationic charge density polymers may include benzene aromatic functional group monomers, such as benzene or pyrollidone, and aromatic amine functional group monomers, such as imidazole or imidazole derivative.

The resulting metal features include TSVs 160 in the substrate 110, as well as metal pads 150, metal lines 170, first dummy structures 180, and second dummy structures 190 in the dielectric layer 120. The TSVs 160, the metal pads 150, the metal lines 170, the first dummy structures 180, and the second dummy structures 190 may thus be formed substantially simultaneously, and may each have substantially similar compositions.

Each TSV 160 may be substantially aligned or substantially centered below a corresponding metal pad 150, such that each TSV 160 may have a central axis 162 substantially coincident with a central axis 152 of the corresponding metal pad 150. This may even be true in implementations in which the footprint shapes of the TSV 160 and its corresponding metal pad 150 are different, such as where the metal pad 150 may have a substantially square footprint and the TSV 160 has a substantially circular footprint (as shown in the example depicted in FIG. 5). Each TSV 160 may include a bulk portion and a lining. For example, as depicted in FIG. 3, one or more isolation layers 142 may interpose one or more bulk portions 164 and surrounding regions of the substrate 110.

After deposition, a top surface of the metal features may have different heights relative to the underlying dielectric layer 120, or the thicknesses of the metal features may otherwise vary, depending on the particular deposition processing utilized and the dimensions and spacing of the openings 130 and 140, the ECP bath solution and additives utilized, and/or other factors. Issues with such bump height variation and overburden thickness may increase manufacturing costs and procedural times associated with planarization, and can induce defects in subsequent fabrication processes. However, bump height may be reduced according to one or more aspects of the present disclosure. For example, during the ECP utilized for their formation, the second dummy structures 190 are larger than the first dummy structures 180, such that the larger, second dummy structures 190 may accumulate more suppressors during the ECP processing, and may thus grow material at lower rates relative to the smaller, first dummy structures.

Prior to planarizing, the metal that forms the second dummy structures 190 may extend above the dielectric layer 120 to a maximum thickness T1 that, for example, may not be greater than about one micron. The metal that forms the first dummy structures 180 may extend above the dielectric layer 120 to a maximum thickness T2 that, for example, may not be greater than about 0.5 microns.

Figure 4:
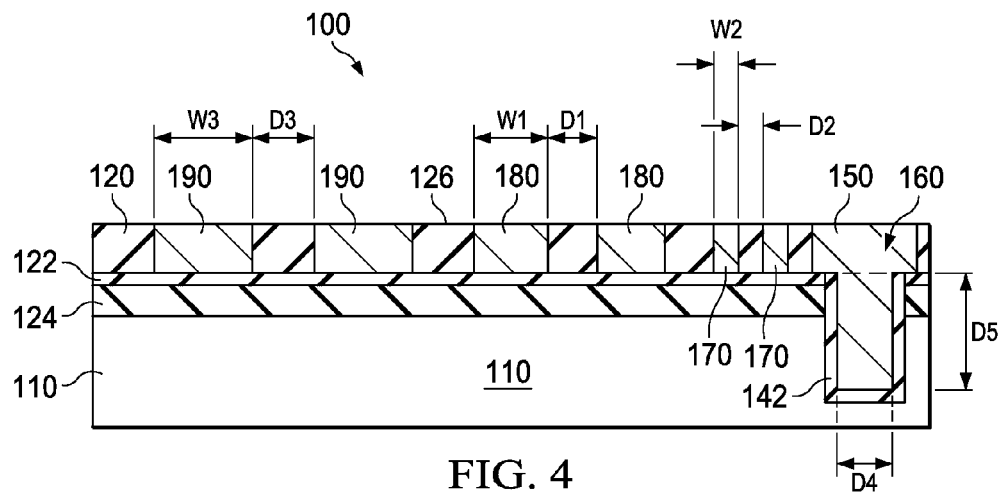
FIG. 4 is a sectional view of the apparatus shown in FIG. 3 in a subsequent stage of manufacture in accordance with some embodiments.

FIG. 4 is a sectional view of the apparatus 100 shown in FIG. 3 in a subsequent stage of manufacture in accordance with some embodiments. FIG. 4 depicts the apparatus 100 after planarizing the metal features, thus further forming the metal pads 150, the metal lines 170, the smaller dummy structures 180, and the larger dummy structures 190, such that these features extend to substantially the same height relative to the dielectric layer 120 and/or the substrate 110.

For example, each of the metal pads 150, the metal lines 170, the smaller dummy structures 180, and the larger dummy structures 190 may be planarized to have surfaces substantially flush with the upper (relative to the orientation of the page) surface 126 of the dielectric layer 120 and/or another common surface. Such planarizing may comprise one or more chemical-mechanical-polishing (CMP) processes, although other processes are also within the scope of the present disclosure.

As stated above, the larger dummy structures 190 may allow for reduced bump height variation and reduced overburden thickness. Each of the smaller dummy structures 180 may have a width W1 that is at least about three times greater than a width W2 of each metal line 170. However, each of the larger dummy structures 190 may have a width W3 that is at least about five times greater than the width W2 of each metal line 170. The width W2 of each metal line 170 may range between about 0.1 microns and about 1.0 microns. A distance D1 between outer edges of adjacent ones of the smaller dummy structures 180 may range between about 100% and about 250% of a distance D2 between outer edges of adjacent ones of the metal lines 170. A distance D3 between outer edges of adjacent ones of the larger dummy structures 190 may range between about 100% and about 250% of the distance D2 between outer edges of adjacent ones of the metal lines 170.

An aspect ratio of each TSV 160 may be about 4:1, or more. The aspect ratio may be a ratio of depth-to-width and/or depth-to-diameter. A diameter D4 of each TSV 160 may be about fifteen microns, or less, and a depth D5 of each TSV 160 may be about sixty microns, although other dimensions are also within the scope of the present disclosure.

Figure 5:
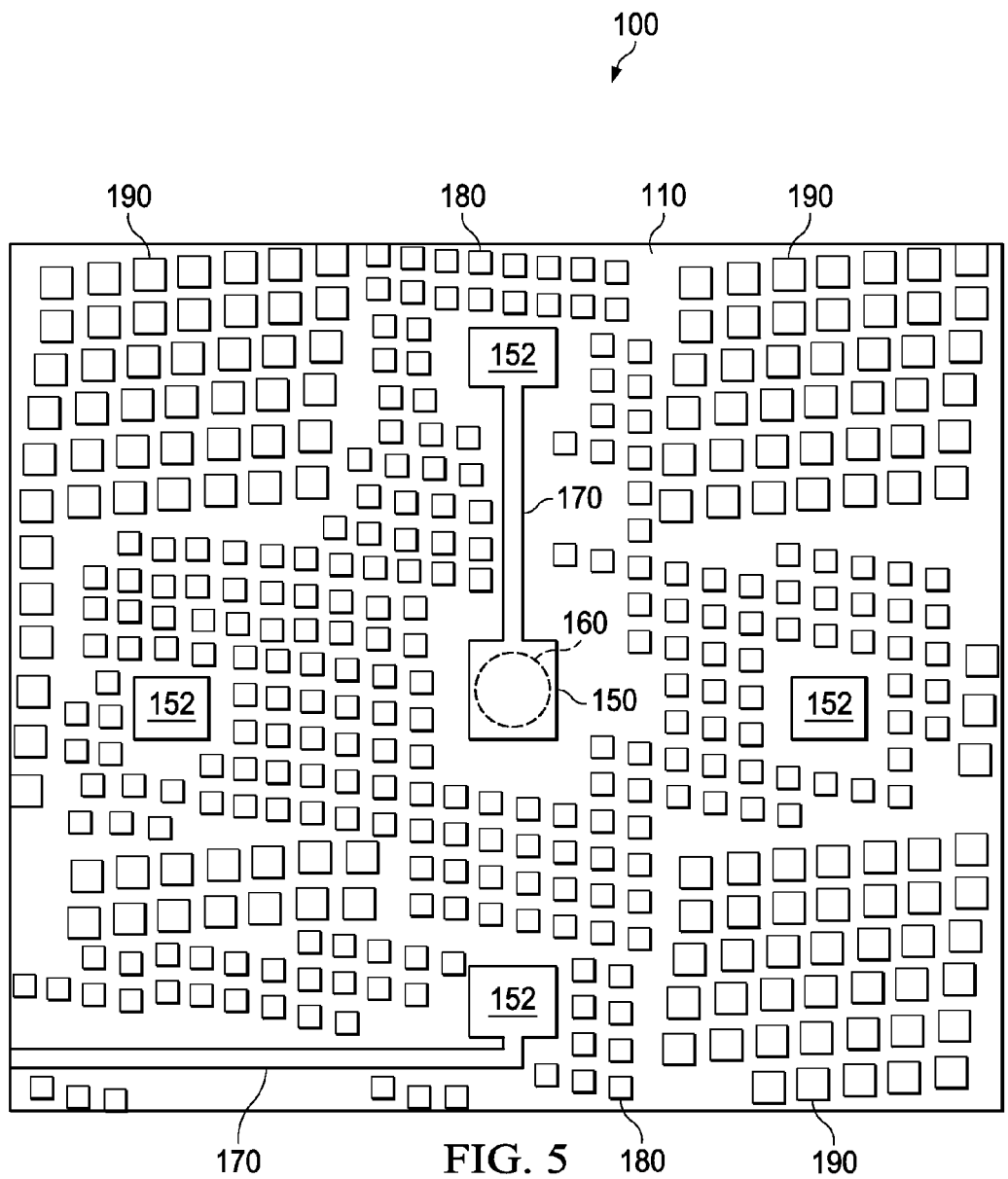
FIG. 5 is a plan view of at least a portion of apparatus in accordance with some embodiments.

FIG. 5 is a plan view of at least a portion of the apparatus 100 in accordance with some embodiments. FIG. 5 depicts the apparatus 100 after the planarizing. The apparatus 100 may further comprise additional metal pads 152. The additional metal pads 152 may be formed substantially simultaneously with the metal pads 150, the metal lines 170, the smaller dummy structures 180, and the larger dummy structures 190 and may also be of substantially similar composition. After planarization, the TSVs 160, metal pads 150, metal pads 152, metal lines 170, smaller dummy structures 180, and larger dummy structures 190 may each have substantially similar thicknesses.

In subsequent steps, interconnect structures, additional metal layers, vias, and/or solder bumps (not shown) may be formed over the apparatus 100, and may be electrically coupled to ones of the metal pads 150, the metal pads 152, the TSVs 160, and the metal lines 170.

In view of all of the above, as well as the example implementations depicted in FIGS. 1-5, a person having ordinary skill in the art will readily recognize that the present disclosure introduces one or more apparatus comprising a substrate, a dielectric layer on the substrate, a plurality of metal pads in the dielectric layer, a plurality of through-silicon-vias in the substrate, a plurality of metal lines in the dielectric layer, a plurality of first dummy structures in the dielectric layer, and a plurality of second dummy structures in the dielectric layer. The plurality of first dummy structures in the dielectric layer may each have a first width that is at least about three times greater than a second width of each of the plurality of metal lines. The plurality of second dummy structures in the dielectric layer may each have a third width that is at least about five times greater than the second width of each of the plurality of metal lines. The plurality of TSVs, the plurality of metal pads, the plurality of metal lines, the plurality of first dummy structures, and the plurality of second dummy structures may each have substantially similar thicknesses and substantially similar compositions.

The dielectric layer may be or comprise an anti-reflective-coating layer and a dielectric layer interposing the anti-reflective-coating layer and the substrate. The dielectric layer may be a first dielectric layer, and the apparatus may further comprise at least one second dielectric layer interposing the first dielectric layer and the substrate. The second dielectric layer may comprise an etch-stop layer and an isolation layer interposing the etch-stop layer and the substrate.

Each through-silicon-via (TSV) may be located below a corresponding one of the plurality of metal pads, perhaps substantially aligned and/or centered below the corresponding one of the plurality of metal pads, and may have a first central axis substantially coincident with a second central axis of the corresponding one of the plurality of metal pads. Each TSV may include a bulk portion and a lining interposing the bulk portion and substrate. An aspect ratio of each TSV may be not less than about 4:1 and the aspect ratio may be a depth-to-diameter ratio. A diameter of each TSV may be not more than about fifteen microns.

In some embodiments, the second width of each of the plurality of metal lines may range between about 0.1 microns and about 1.0 microns. A distance between outer edges of adjacent ones of the plurality of first dummy structures may range between about 100% and about 250% of a distance between outer edges of adjacent ones of the plurality of metal lines, and a distance between outer edges of adjacent ones of the plurality of second dummy structures may range between about 100% and about 250% of the distance between outer edges of adjacent ones of the plurality of metal lines.

The present disclosure also introduces one or more methods comprising forming a dielectric layer over a substrate, forming a plurality of first openings in the dielectric layer, forming a plurality of second openings extending through the dielectric layer and into the substrate, and depositing metal in each of the plurality of first openings, in each of the plurality of second openings, and on the dielectric layer, thereby forming a plurality of metal features in the plurality of first openings and a through-silicon-via in each of the plurality of second openings.

The plurality of metal features may comprise a plurality of metal pads, a plurality of metal lines each having a first width, a plurality of first dummy structures each having a second width that is not less than about three times greater than the first width, and a plurality of second dummy structures each having a third width that is not less than about five times greater than the first width.

The plurality of TSVs, the plurality of metal pads, the plurality of metal lines, the plurality of first dummy structures, and the plurality of second dummy structures may be formed substantially simultaneously.

Such methods may further comprise planarizing the metal so that each of the plurality of metal pads, the plurality of metal lines, the plurality of first dummy structures, and the plurality of second dummy structures extend to substantially the same height over the substrate, or so that each of the plurality of metal pads, the plurality of metal lines, the plurality of first dummy structures, and the plurality of second dummy structures has a surface substantially flush with a surface of the dielectric layer.

Prior to the planarizing, the metal that will form the plurality of second dummy structures may extend above the dielectric layer to a maximum thickness not greater than about one micron, and the metal that will form the plurality of first dummy structures may extend above the dielectric layer to a maximum thickness not greater than about 0.5 microns.

In some embodiments, forming the plurality of first openings occurs prior to forming the plurality of second openings, and forming the plurality of second openings includes forming the plurality of second openings through corresponding ones of the plurality of first openings. Forming the plurality of second openings may comprise forming a photoresist layer over the dielectric layer and each of the plurality of first openings, patterning the photoresist layer to form a plurality of third openings in the photoresist layer each aligned with a corresponding one of the plurality of first openings, and etching the substrate through the plurality of third openings to form the plurality of second openings.

The ones of the plurality of first openings that correspond to ones of the plurality of third openings may comprise corresponding ones of the plurality of metal pads after depositing the metal in each of the plurality of first openings.

Such methods may further comprise forming an isolation layer lining each of the plurality of second openings prior to depositing the metal in each of the first openings. Depositing the metal may utilize electrochemical plating.

The present disclosure also introduces apparatus comprising a substrate, a dielectric layer on the substrate, a metal pad in the dielectric layer, and a through-silicon-via in the substrate, wherein the through-silicon-via (TSV) is located below the metal pad. Such apparatus also comprises a metal line in the dielectric layer, a first dummy structure in the dielectric layer having a first width that is at least about three times greater than a second width of the metal line, and a second dummy structure in the dielectric layer having a third width that is at least about five times greater than the second width of the metal line. The TSV, the metal pad, the metal line, the first dummy structure, and the second dummy structure may each have substantially similar thicknesses and substantially similar compositions.

In some embodiments, the dielectric layer further comprises an anti-reflective-coating layer, and the dielectric layer interposes the anti-reflective-coating layer and the substrate. The dielectric layer may be a first dielectric layer, and the apparatus may further comprise at least one second dielectric layer interposing the first dielectric layer and the substrate. The second dielectric layer may comprise an etch-stop layer, and an isolation layer may interpose the etch-stop layer and the substrate.

The TSV may be substantially aligned and/or centered below the metal pad, may have a first central axis substantially coincident with a second central axis of the corresponding one of the plurality of metal pads, and may include a bulk portion and a lining interposing the bulk portion and substrate. An aspect ratio of the TSV may be not less than about 4:1, and may be a depth-to-diameter ratio. A diameter of the TSV may be not more than about fifteen microns.

In some embodiments, the second width of the metal line may range between about 0.1 microns and about 1.0 microns.

The TSV may be a first TSV, and the apparatus may further comprise a second TSV. Similarly, the metal pad may be first metal pad, and the apparatus may further comprise a second metal pad, wherein each TSV is located below a corresponding metal pad. The metal line may be a first metal line, the first dummy structure may be a first first dummy structure, the second dummy structure may be a first second dummy structure, and the apparatus may further comprise a second metal line, a second first dummy structure, and a second second dummy structure.

A distance between outer edges of the first and second first dummy structures may range between about 100% and about 250% of a distance between outer edges of the first and second metal lines, and a distance between outer edges of the first and second second dummy structures may range between about 100% and about 250% of the distance between outer edges of the first and second metal lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
   a substrate;
   a dielectric layer disposed over the substrate;
   a plurality of metal pads disposed in the dielectric layer;
   a plurality of through-silicon-vias (TSVs) extending into the substrate, wherein each of the plurality of TSVs is located below a corresponding one of the plurality of metal pads;
   a plurality of metal lines disposed in the dielectric layer;
   a plurality of first dummy structures disposed in the dielectric layer, wherein each of the plurality of first dummy structures has a first width that is at least about three times greater than a second width of each of the plurality of metal lines; and
   a plurality of second dummy structures disposed in the dielectric layer, wherein each of the plurality of second dummy structures has a third width that is at least about five times greater than the second width of each of the plurality of metal lines.

2. The apparatus of claim 1 wherein each of the plurality of TSVs is disposed substantially centered below the corresponding one of the plurality of metal pads.

3. The apparatus of claim 1 wherein an aspect ratio of each of the plurality of TSVs is not less than about 4:1.

4. The apparatus of claim 1 wherein a diameter of each of the plurality of TSVs is not more than about fifteen microns.

5. The apparatus of claim 1 wherein the second width of each of the plurality of metal lines ranges between about 0.1 microns and about 1.0 microns.

6. The apparatus of claim 1 wherein a distance between outer edges of adjacent ones of the plurality of first dummy structures ranges between about 100% and about 250% of a distance between outer edges of adjacent ones of the plurality of metal lines.

7. The apparatus of claim 1 wherein a distance between outer edges of adjacent ones of the plurality of second dummy structures ranges between about 100% and about 250% of a distance between outer edges of adjacent ones of the plurality of metal lines.

8. The apparatus of claim 1 wherein:
   a distance between outer edges of adjacent ones of the plurality of first dummy structures ranges between about 100% and about 250% of the distance between outer edges of adjacent ones of the plurality of metal lines; and
   a distance between outer edges of adjacent ones of the plurality of second dummy structures ranges between about 100% and about 250% of the distance between outer edges of adjacent ones of the plurality of metal lines.

9. The apparatus of claim 1 wherein each of the plurality of TSVs, each of the plurality of metal pads, each of the plurality of metal lines, each of the plurality of first dummy structures, and each of the plurality of second dummy structures have substantially similar thicknesses.

10. The apparatus of claim 9 wherein each of the plurality of TSVs, each of the plurality of metal pads, each of the plurality of metal lines, each of the plurality of first dummy structures, and each of the plurality of second dummy structures have substantially similar compositions.

11. The apparatus of claim 1 wherein each of the plurality of TSVs, each of the plurality of metal pads, each of the plurality of metal lines, each of the plurality of first dummy structures, and each of the plurality of second dummy structures have substantially similar compositions.

12. An apparatus, comprising:
a substrate;
a dielectric layer disposed on the substrate;
a metal pad disposed in the dielectric layer;
a through-silicon-via (TSV) in the substrate, wherein the TSV is located below the metal pad;
a metal line disposed in the dielectric layer;
a first dummy structure disposed in the dielectric layer, wherein the first dummy structure has a first width that is at least about three times greater than a second width of the metal line; and
a second dummy structure disposed in the dielectric layer, wherein the second dummy structure has a third width that is at least about five times greater than the second width of the metal line.

13. The apparatus of claim 12 wherein the second width of the metal line ranges between about 0.1 microns and about 1.0 microns.

14. The apparatus of claim 12 wherein:
the metal line is a first metal line;
the first dummy structure is a first first dummy structure;
the second dummy structure is a first second dummy structure;
the apparatus further comprises:
a second metal line;
a second first dummy structure; and
a second second dummy structure;
a distance between outer edges of the first and second first dummy structures ranges between about 100% and about 250% of a distance between outer edges of the first and second metal lines;
a distance between outer edges of the first and second second dummy structures ranges between about 100% and about 250% of a distance between outer edges of the first and second metal lines;
a distance between outer edges of the first and second first dummy structures ranges between about 100% and about 250% of a distance between outer edges of the first and second metal lines; and
a distance between outer edges of the first and second second dummy structures ranges between about 100% and about 250% of a distance between outer edges of the first and second metal lines.

15. An apparatus, comprising:
a substrate;
a first dielectric layer disposed over the substrate;
a second dielectric layer disposed over the substrate;
a plurality of through-silicon-vias (TSVs) extending through the first dielectric layer and the second dielectric layer and into the substrate;
a plurality of metal pads disposed in the second dielectric layer, wherein each of the TSVs is located below a corresponding one of the metal pads;
a plurality of metal lines disposed in the second dielectric layer, the metal lines having a first width;
a plurality of first dummy structures disposed in the second dielectric layer, the first dummy structures having a second width at least three times greater than the first width of the metal lines; and
a plurality of second dummy structures disposed in the second dielectric layer, the second dummy structures having a third width at least five times greater than the second width of the metal lines.

16. The apparatus of claim 15 wherein the first dielectric layer comprises an etch-stop layer and an isolation layer.

17. The apparatus of claim 15 wherein a central axis of each of the TSVs is substantially coincident with a central axis of the corresponding one of the metal pads.

18. The apparatus of claim 15, further comprising a liner layer along a bottom surface and sidewalls of the TSVs.

19. The apparatus of claim 15, wherein a top surface of the metal pads, a top surface of the metal lines, a top surface of the first dummy structures, and a top surface of the second dummy structures are substantially co-planar with a top surface of the second dielectric layer.

20. The apparatus of claim 15, further comprising a second plurality of metal pads, the second plurality of metal pads having a substantially similar composition as the plurality of metal pads.

* * * * *